United States Patent [19]

Simoudis

[11] Patent Number: 5,283,857
[45] Date of Patent: Feb. 1, 1994

[54] EXPERT SYSTEM INCLUDING ARRANGEMENT FOR ACQUIRING REDESIGN KNOWLEDGE

[75] Inventor: Evangelos Simoudis, Marlboro, Mass.

[73] Assignee: Digital Equipment Corporation, Maynard, Mass.

[21] Appl. No.: 1,911

[22] Filed: Jan. 8, 1993

Related U.S. Application Data

[60] Continuation of Ser. No. 735,320, Jul. 24, 1991, abandoned, which is a division of Ser. No. 270,893, Nov. 14, 1988, abandoned.

[51] Int. Cl.$^5$ .............................................. G06F 15/18
[52] U.S. Cl. ..................................... 395/77; 364/578; 395/919
[58] Field of Search ....................... 395/50, 51, 53, 64, 395/77; 364/578

[56] References Cited

U.S. PATENT DOCUMENTS

| | | | |
|---|---|---|---|
| 4,591,983 | 5/1986 | Bennett et al. | 364/403 |
| 4,648,044 | 3/1987 | Hardy | 364/513 |
| 4,791,578 | 12/1989 | Fazio | 364/480 |
| 4,837,735 | 6/1989 | Allen | 364/513 |
| 4,847,784 | 7/1989 | Clancey | 364/513 |
| 4,860,204 | 8/1989 | Geivdron | 364/513 |
| 4,866,635 | 9/1989 | Kahn | 364/513 |
| 4,922,432 | 5/1990 | Kobayashi | 364/489 |
| 4,967,367 | 10/1990 | Piednoir | 364/489 |
| 4,967,386 | 11/1990 | Maeda | 364/578 |
| 5,016,204 | 5/1991 | Simoudis et al. | 364/578 |
| 5,019,992 | 5/1991 | Brown | 364/512 |
| 5,208,768 | 5/1993 | Simoudis | 364/578 |
| 5,218,557 | 6/1993 | Simoudis | 364/578 |

OTHER PUBLICATIONS

Dixen, J. R., "Artificial Intelligence and Design: A Mechanical Engineering View", 5th Intl. Conf. on AI, 1986, pp. 872–877.
Bond et al., "Integrating Prolog and CADAM to Produce an Intelligent CAD System" IEEE Westex-87, Conference on Expert Systems, 1987, pp. 152–160.
Dixon et al., "Expert Systems for Mechanical Design: Examples of Symbolic Representations of Design Geometries", Engineering with Computers, 2, 1987, pp. 1–10.
Liew, C. W., "Feedback Directed Modification of Designs," IEEE Intl. Joint Conf. Neural Networks, 1990, pp. 237–243.
Kolodner, J., "Extending Problem Solver Capabilities Through Case-Based Inference", Proc. 4th Annual Int'l. Mach. Learning Workshop, 1987, 21–30.
Hinkle, D., "Clavier: A Case Based Autoclave Loading Advisor", Lockheed Artificial Intelligence Center, Mar. 1990.
Maher, M. L., "Process Models for Design Synthesis", AI Magazine, Winter 1990, 49–58.
Mostow et al., "Automated reuse of design plans", Artificial Intelligence in Engineering, 1989, 181–196.
Steinberg et al., "The Redesign System: A Knowledge-Based Approach to VLSI CAD", IEEE Design & Test, Feb. 1985, 45–54.
Kowalski et al., "The VLSI Design Automation Assistant: from Algorithms to Silicon", IEEE Design & Test, Aug. 1985, 33–43.

(List continued on next page.)

Primary Examiner—Michael R. Fleming
Assistant Examiner—Robert W. Downs
Attorney, Agent, or Firm—Albert P. Cefalo; Ronald C. Hudgens; James F. Thompson

[57] ABSTRACT

A new expert system performs a redesign in connection with an original design. The expert system comprises a discrepancy determination component that identifies a discrepancy between operation of the original design and a desired operation. A redesign component including at least one redesign module associated with a discrepancy generates a redesign in response to the original design and the identified discrepancy. Finally, a redesign generation component generates a redesign module in response to a previously-identified discrepancy and design, the redesign module thereafter being used by the redesign component.

10 Claims, 9 Drawing Sheets

OTHER PUBLICATIONS

Rosenbloom et al., "RI-Soar: An Experiment in Knowledge-Intensive Programming in a Problem-Solving Architecture", IEEE Trans. on Pattern Analysis and Machine Intelligence, Sep. 1985, 561–569.

Brown et al., "Knowledge and Control for a Mechanical Design Expert System", IEEE Computer, Jul. 1986, 92–100.

Sharp, H., "KDA—A Tool for Automatic Design Evaluation and Refinement Using the Blackboard Model of Control", 10th Intl. Conf. on Software Engineering, Apr. 1988, 407–416.

Minton, S., "Quantitative Results Concerning the Utility of Explanation-Based Learning", AAAI 88 Proceedings, vol. 2, Aug. 1988, 564–569.

Huhns et al., "Argo: A System for Design by Analogy," Proc 4th Conf. on Artificial Intelligence Applications, Mar. 1988, 146–151.

META KNOWLEDGE ACQUISITION

INPUTS

DESIGN
        (ORIG DES ID, (RED SEQ$_n$,...)]
    DISC ID
    DISC CAUSE ID
    REDESIGN OPERATORS AND MODULES

OUTPUTS:

NEW DES
        (ORIG DES ID, (RED SEQ$_{n+1}$,...)]
    SPECIFIC META RULES
    ABSTRACT META RULES

ALGORITHM:

100  SELECT A REDESIGN OPERATOR MODULE ASSOCIATED WITH DISC ID AND DISC CAUSE ID AND APPLY TO ORIGINAL DESIGN TO FORM REDESIGN

101  DOES REDESIGN ELIMINATE DISCREPENCY?  ← (B) FROM FIG. 4B
        NO → (loop back)  YES ↓

102  GENERATE META RULE AND ABSTRACTED META RULE

103  EXIT

104  DOES THE NUMBER OF REDESIGN ITERATIONS EXCEED A PREDETERMINED THRESHOLD?  NO → (C) FIG. 4B
        YES ↓

105  ARE THERE ANY OTHER REDESIGN OPERATOR MODULES WHICH MAY BE USED TO ELIMINATE DISCREPANCY?  YES
        NO ↓

106  EXIT
        ↓
    (A) FIG. 4B

FIG. 4A

REDESIGN KNOWLEDGE ACQUISITION

120    CREATE A REDESIGN SEQUENCE IN CONNECTION WITH A SPECIFIC DESIGN AND SET OF REDESIGN GOALS (FIG. 5B)

↓

121    ADD REDESIGN SEQUENCE TO OTHERS PREVIOUSLY CREATED IN CONNECTION WITH SAME REDESIGN GOALS

↓

122    CREATE NEW REDESIGN OPERATOR MODULE FROM SEQUENCES CREATED IN CONNECTION WITH REDESIGN GOALS (FIG. 5C)

FIG. 5A

REDESIGN MODULE ACQUISITION

I. CREATION

130   OPERATOR IDENTIFIES REDESIGN GOALS AND SELECTS REDESIGN OPERATORS WHICH MAY BE USED TO ACHIEVE REDESIGN GOALS

↓

131   OPERATOR IDENTIFIES SEQUENCE OF APPLICATION OF REDESIGN OPERATORS FOR PARTICULAR REDESIGN OPERATION TO ACHIEVE REDESIGN GOALS

↓

132   SEQUENCE IS SAVED IN ASSOCIATION WITH DISC ID, DISC CAUSE ID AND REDESIGN MODULE NAME

FIG. 5B

2. REDESIGN MODULE CREATION

140    RETRIEVE REDESIGN SEQUENCES ASSOCIATED WITH SELECTED DISC ID, DISC CAUSE ID AND REDESIGN MODULE NAME

141    GENERALIZE REDESIGN OPERATOR IN RETRIEVED REDESIGN SEQUENCES

142    GENERATE REDESIGN OPERATORS PORTION FROM UNION OF GENERALIZATED REDESIGN OPERATORS, INSERT INTO REDESIGN MODULE

143    GENERATE ELIGIBILITY RULES USING DISC ID AND DISC CAUSE ID AS CONDITIONS, REDESIGN MODULE NAME, IN ACTION LIST, INSERT INTO REDESIGN MODULE

144    GENERATE REDESIGN SCHEDULING RULES DEFINED BY RETRIEVED SEQUENCES, INSERT INTO REDESIGN MODULE

FIG. 5C

EXPERT SYSTEM INCLUDING ARRANGEMENT FOR ACQUIRING REDESIGN KNOWLEDGE

This application is a continuation of application Ser. No. 07/735,320, filed Jul. 24, 1991, now abandoned, which is a division of application Ser. No. 07/270,893, filed Nov. 14, 1988, now abandoned.

INCORPORATION BY REFERENCE

U.S. patent application Ser. No. 07/106,840, filed Oct. 8, 1987, in the name of Evangelos Simoudis, for System Design Tool For Assisting In The Design Of A Complex System, and assigned to the assignee of the present application (hereinafter referred to as "the Simoudis application"), incorporated herein by reference.

E. Simoudis, Learning Redesign Knowledge, (attached hereto as an appendix), incorporated herein by reference.

BACKGROUND OF THE INVENTION

The invention relates generally to the field of digital computer systems, and more specifically to expert systems for use in connection with digital computer systems.

The aforementioned Simoudis application describes an expert system that assists in the redesign of complex systems, such as electrical circuits. In using the expert system, an operator supplies an initial design for the complex system, and a set of operational constraints. The expert system simulates the design and determines whether the operation of the design, as indicated by the simulation, conforms to the operational constraints. If not, a redesign element assists in the redesign of the complex system to more closely conform to the operational constraints. The expert system then simulates the redesigned complex system. This procedure may be repeated several times until the operation of the complex system conforms to the operational constraints specified by the operator.

To accomplish the redesign, the expert system in the aforementioned Simoudis application includes redesign operators, each of which operates to modify one of various aspects of the design, based on knowledge, in the form of rules, organized in a multi-level hierarchy. In response to the representation of the design, as provided by the operator or in response to a redesign, design constraints and the cause of a discrepancy between the operational constraints and the simulated operation of the design, a solution selection knowledge module selects one of many redesign solutions which are capable of eliminating the discrepancies by modifying the design. Each redesign solution, in turn, includes the various redesign operators, and redesign operator control knowledge indicating the order in which the redesign operators are to be applied to accomplish the redesign.

The solution selection knowledge and the redesign operator control knowledge in the expert system are both in the form of rules. The rules in the solution selection knowledge module fire in response to the information concerning the various solutions which are capable of eliminating the discrepancies, the design constraints and the causes of the discrepancies between the simulated operation and the desired operation of the complex system. Firing of a rule in the solution selection knowledge module initiates operation of a redesign solution. The rules comprising the redesign operator control knowledge of a redesign solution, on the other hand, determines the order in which the redesign operators are to be applied.

The redesign operators, which are operators that indicate the various primitive redesign operations that may be provided in the system, form part of the "knowledge" in the system. The redesign operator control knowledge provides a level of control knowledge as to the sequencing of application of the redesign operators to achieve a particular redesign goal. The solution selection knowledge provides a level of "meta-knowledge", that is, knowledge about the control knowledge provided by the redesign operator control knowledge in the expert system.

SUMMARY OF THE INVENTION

The invention provides a new and improved expert system which includes the capability of learning knowledge and meta-knowledge during operation.

In brief summary, the new expert system performs a redesign in connection with an original design. The expert system comprises a discrepancy determination component that identifies a discrepancy between operation of the original design and a desired operation. A redesign component including at least one redesign module associated with a discrepancy generates a redesign in response to the original design and the identified discrepancy. Finally, a redesign generation component generates a redesign module in response to a previously-identified discrepancy and design, the redesign module thereafter being used by the redesign component.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIGS. 3 through 5C are flow diagrams useful in understanding the operation of the expert system depicted in FIGS. 1 and 2.

DETAILED DESCRIPTION OF AN ILLUSTRATIVE EMBODIMENT

Figure 1:
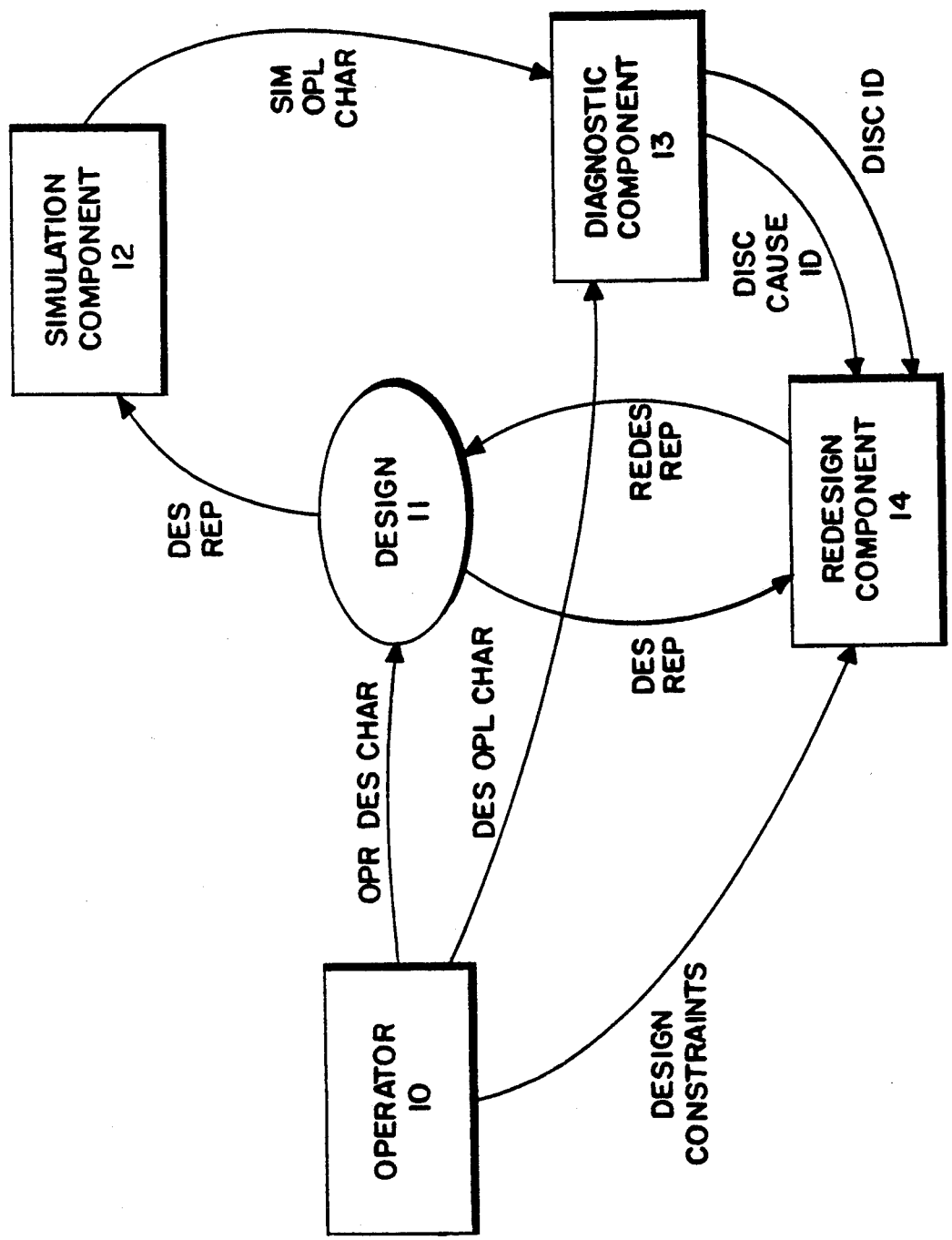
FIGS. 1 and 2 are functional block diagrams of an expert system constructed in accordance with the invention.

The invention will be described in connection with an expert system, which may be in the form of a computer program processed by a digital data processing system, for redesigning a complex system as described in the aforementioned Simoudis application. By way of background FIG. 1, which is generally taken from that application, depicts a general functional block diagram of a system design tool which includes the invention. With reference to FIG. 1, the system design tool receives from an operator, which may be the designer of the complex system for whose design the system design tool will be used, through an operator interface 10, OPR DES CHAR operator input design characteristics, from which a design representation 11 is generated. After the operator has finished providing the design representation 11, it is coupled, as a DES REP design representation, to a simulation component 12. The simulation component 12 performs a simulation of the design of the complex system as represented by the design representation 11. The simulation component 12 provides SIM OPL CHAR simulated operational characteristics which illustrate the operation of the complex system as represented by the design representation 11.

The SIM OPL CHAR simulated operational characteristics provided by the simulation component 12 are coupled to a diagnostic component 13. The diagnostic component 13 also receives from the operator interface 10 DES OPL CHAR desired operational characteristics which describe the desired operation of the complex system represented by design representation 11. The diagnostic component 13 identifies discrepancies between the SIM OPL CHAR simulated operational characteristics and the DES OPL CHAR desired operational characteristics and also determines in response thereto DISC ID discrepancy identifications, which identify the discrepancies between the SIM OPL CHAR simulated operational characteristics and the DES OPL CHAR desired operational characteristics, and the DISC CAUSE ID discrepancy cause identifications (step 601) which identify causes of the identified DIS IDs discrepancy identifications.

The DISC ID discrepancy identifications and DISC CAUSE ID discrepancy cause identifications identified by the diagnostic component 13 are coupled to a redesign component 14. The redesign component also receives a set of DESIGN CONSTRAINTS from the operator interface 10 and the DES REP design representation from the design representation 11. The DESIGN CONSTRAINTS identify constraints on, for example, the physical design of the design 11. In response to all of these inputs, the redesign component 14 generates REDES REP redesigned design representation, which represents a design representation as modified to reduce or eliminate the operational discrepancies represented by the DISC ID discrepancy identifications and DISC CAUSE ID discrepancy cause identifications identified by the diagnostic component 13, within the DESIGN CONSTRAINTS defined by the operator through operator interface 10, if the DESIGN CONSTRAINTS can be satisfied (step 603).

The REDES REP redesigned design representation generated by the redesign component forms a new design representation 11. The new design representation 11 is coupled as the DES REP design representation to the simulation component 12, which again performs a simulation on the redesigned design representation. The procedure described above is repeated to enable the diagnostic component 13 to identify new DISC CAUSE ID discrepancy cause identifications and redesign component 14 to generate a new REDES REP redesigned design representation. The process is iteratively repeated until the diagnostic component 13 determines that the SIM OPL CHAR simulated operational characteristics correspond to the DES OPL CHAR design operational characteristics provided by the operator. At that point, the design of the complex system, as represented by the design representation 11, corresponds to the design required to provide the DES OPL CHAR design operational characteristics.

Figure 2:
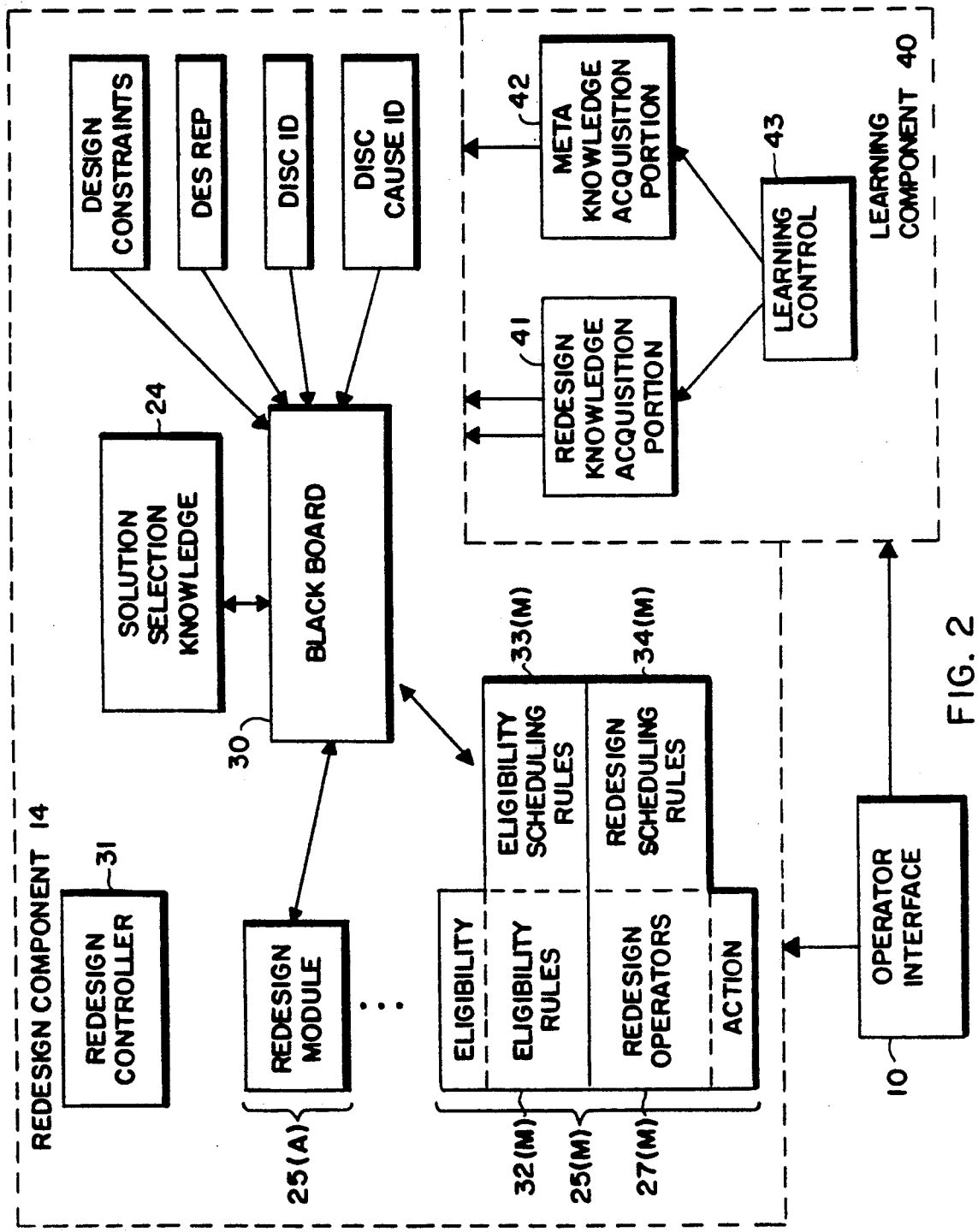

The simulation component 12 and diagnostic component 13 in the system design tool may be conventional components. FIG. 2 contains a functional block diagram of the redesign component 14. With reference to FIG. 2, the redesign component 14 includes a plurality of redesign modules 25A through 25(M) (generally identified by reference numeral 25) all of which have access to a blackboard 30 in which the redesign modules 25 and other components described below store information. The redesign modules 25, under control of a redesign controller 31, effectively perform different types of redesign operations in connection with the design representation 11. A redesign module 25 includes a redesign operators module 27 which includes one or more redesign operators. Each redesign operator performs a primitive redesign operation in connection with a design defined by the DES REP design representation. Each redesign module 25 also includes a redesign scheduling rules module 34 which defines sequences of redesign operators in the redesign operators module 27 to enable a redesign operation to occur.

Each redesign module 25 also includes an eligibility rules module 32 and an eligibility scheduling rules module 33. The eligibility rules module 32 in-a redesign module 33 includes eligibility rules, which are described below, which identify the discrepancies and discrepancy causes which the redesign module 25 may be used to obviate or correct. The eligibility scheduling rules module 33 includes eligibility scheduling rules which identify the number of eligibility rules which may be applied during a given redesign operation.

During a particular redesign operation, after the diagnostic component 13 has generated a DISC ID discrepancy identification and a DISC CAUSE ID discrepancy cause identification and posted them on the blackboard 30, the redesign controller 31 processes the eligibility rules in all of the redesign modules 25 by comparing the eligibility rules in the eligibility rules module 32 of all of the redesign modules 25 to the DISC ID discrepancy identification and DISC CAUSE ID discrepancy cause identification. If an eligibility rule fires, the redesign controller stores, on the blackboard 30, the identification of the redesign module 25 which includes the eligibility rule. In some cases, the redesign controller 31 may determine that multiple eligibility rules fire during the comparison operation.

The redesign component 14 also includes a solution selection knowledge module 24. The solution selection knowledge module 24 includes solution selection rules which are used to select among multiple redesign modules 25 whose identifications may have been stored on the blackboard 30 during the eligibility rule comparison operation. Following processing of the eligibility rules 32, the redesign controller 31 processes the solution selection rules by comparing the solution selection rules to the contents of the blackboard 30, including the DESIGN CONSTRAINTS, the DISC ID discrepancy identification and the DISC CAUSE ID discrepancy cause identification. If a solution selection rule fires, the redesign controller 31 stores the identification of the redesign module 25 contained in the fired solution selection rule in the blackboard 30.

The redesign controller 31 thereafter uses the redesign module 25 to perform the redesign operation. In particular, the redesign controller 31 initiates a redesign sequence defined by the redesign scheduling rules 34 and redesign operators 27 to perform the redesign operation on the design identified by the DES REP design representation on the blackboard. The redesigned DES REP design representation is then available for simulation and diagnosis to determine if its operational characteristics correspond to the DES OPL CHAR desired operational characteristics defined by the operator at the operator interface 10.

As noted above, the redesign operators in redesign operator module 27, eligibility rules in eligibility rules module 32, the various scheduling rules and the solution selection rules in solution selection knowledge module 24 are all in the form of production rules. Each production rule has a left hand side, which identifies one or more conditions, and a right hand side, which has an action list. In a production rule in a solution selection knowledge module 24, for example, the left hand side may identify a DESIGN CONSTRAINT, a DISC CAUSE ID discrepancy cause identification, and a DISC ID discrepancy identification. In addition, a production rule in a solution selection knowledge module 24 may indicate when one or more of its associated redesign modules 25 may be used in the redesign operation. The action list in the right hand side of such a production rule specifies which redesign module 25 will be used in connection with a redesign operation.

Similarly, the left hand side of a redesign operator 27 identifies modules of a design on which the operator can operate. That is, if the redesign operator 27 is intended to remove or add a specific type of element of the design, under specific conditions in the placement or interconnection of the element in relation to other elements of the design, the conditions in the left hand side identify those placement and interconnection conditions. The action list comprising the right hand side of such a production rule operate to actually perform the redesign, that is, to remove the element from, or add the element to, the design representation. Each redesign operator 27 effectively defines a primitive redesign operation, and multiple redesign operators may be used in sequence to generate a redesign to obviate a discrepancy identified by a DISC CAUSE ID discrepancy cause identification 23.

An eligibility rule in the eligibility rules module 32 in a redesign module 25 indicates whether the redesign module 25 may be used to perform a redesign operation. In each eligibility rule, the conditions in its left hand side identify discrepancies and discrepancy causes, and the action list in the right hand side identify the redesign module 25.

In addition, the redesign module 25 includes two types of scheduling rules, including eligibility scheduling rules comprising an eligibility scheduling rules module 33 and redesign scheduling rules comprising redesign scheduling rules module 34. The eligibility scheduling rules identify how many eligibility rules will be applied during each redesign operation. The redesign scheduling rules in the redesign scheduling rules module 34 in a redesign module 25 identifies one or more sequences in which redesign operators 27 are to be applied to achieve a redesign operation.

Returning to FIG. 2, in accordance with the invention, the expert system further includes a learning component 40 including a redesign module knowledge acquisition module 41, a meta knowledge acquisition module 42 and a learning control module 43 which, under control of the operator through operator interface 10, controls the redesign module knowledge acquisition module 41 and meta knowledge acquisition module 42. The redesign module knowledge acquisition module 41 serves to generate redesign operators for module 27 and eligibility rules for module 32 and redesign scheduling rules for module 34 in a redesign module 25. The meta knowledge acquisition module 41 serves to generate rules defining the solution selection knowledge modules 24. Both the redesign module knowledge acquisition module 41 and the meta knowledge acquisition module 42 operate by observation of redesign operations specified by the operator interface 10 during a learning phase as described below in connection with the flow diagrams in FIGS. 4 through 5C.

Figure 3:
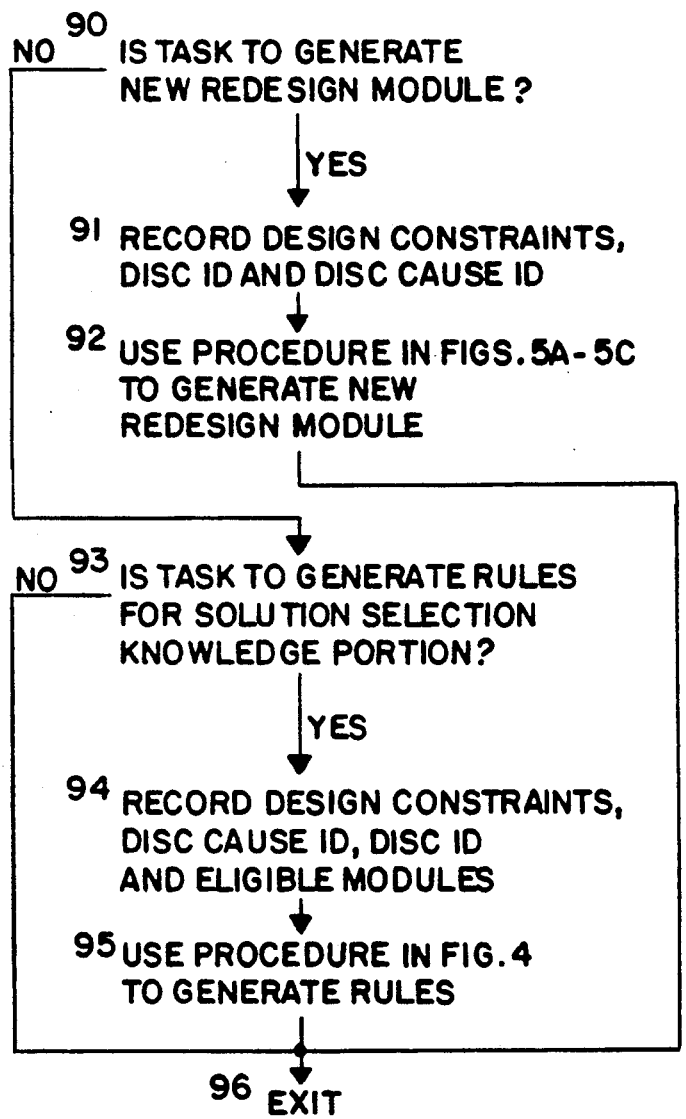

The general procedures performed by the learning component 40 are depicted in FIG. 3. With reference to FIG. 3, the learning component 40, and particularly learning control module 43, first determines whether it is to generate a new redesign module 25 (step 90), as determined by the operator through operator interface 10. If so, it sequences to step 91, in which it records the DESIGN CONSTRAINTS, DISC ID discrepancy identification(s) and DISC CAUSE ID discrepancy cause identification(s), and then uses the procedures described below in connection with FIGS. 5A through 5C to produce a new redesign module 25 (step 92).

If the learning control module 43 determines that the learning module 40 is not to generate a new redesign module 25, it determines whether it is to generate additional rules for the solution selection knowledge module 24 (step 93). If so, it records the DESIGN CONSTRAINTS, DISC CAUSE ID discrepancy cause identification(s), DISC ID discrepancy identification(s) and redesign modules 25 which may be used in connection with a redesign operation (step 94) and performs the procedure identified in FIG. 4 to generate the required rules (step 95).

Following either generation of a new redesign module 25 in step 92, or generation of additional rules for the solution selection knowledge module 24, or if it determines that it is to do neither, the learning control module 43 exits to wait for further instructions from the operator interface 10.

Figure 4B:
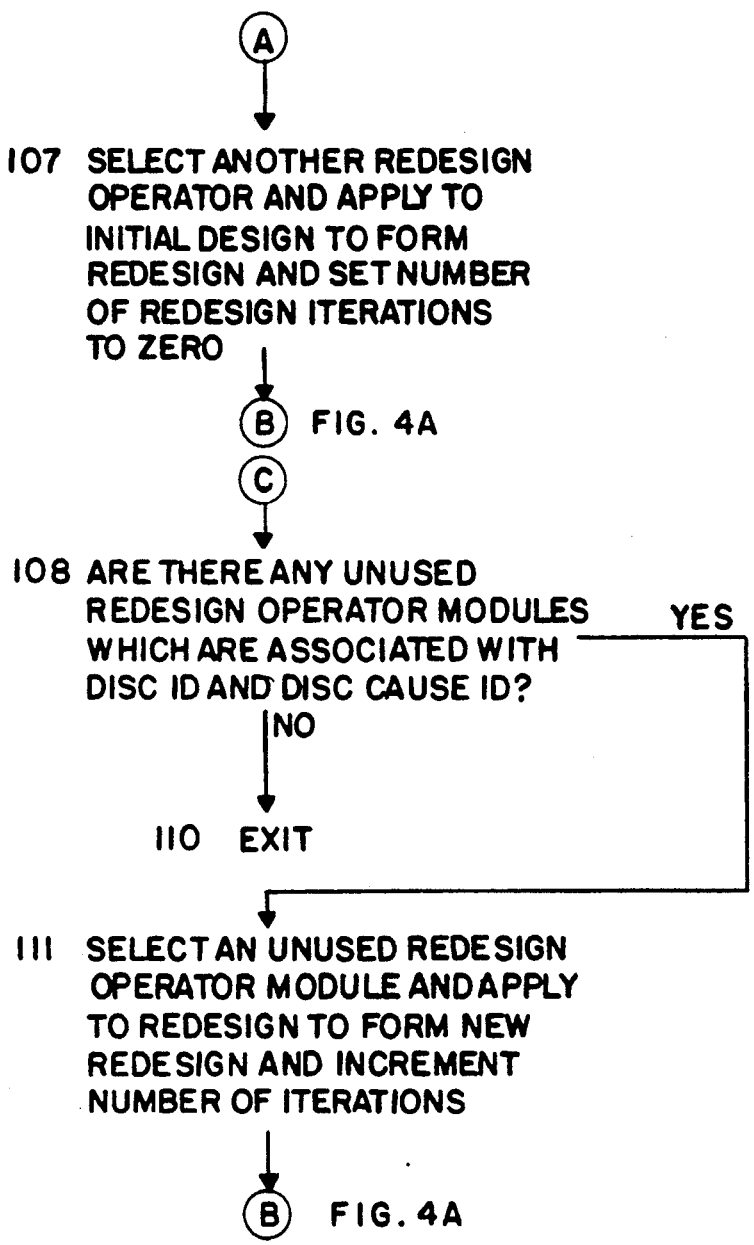
Figure 6:
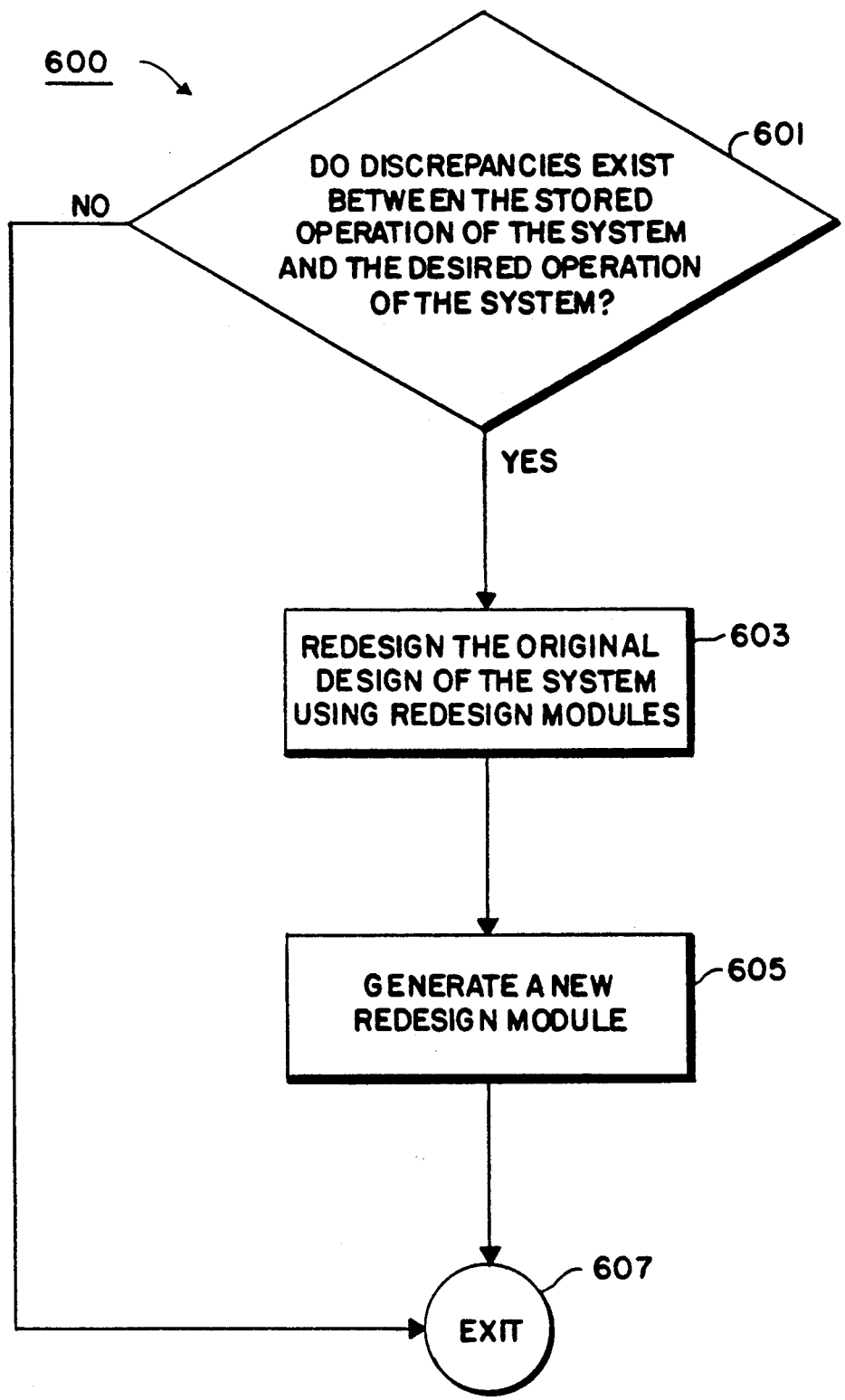
FIG. 6 illustrates a flow diagram of the preferred implementation and the method used to perform a redesign operation.

The operations performed by the meta knowledge acquisition module 42 are depicted in FIGS. 4A and 4B, and the operations performed by the redesign module knowledge acquisition module are depicted in FIGS. 5A through 5C (FIG. 6, step 605). With reference to FIGS. 4A and 4B, the meta knowledge acquisition module 42, in conjunction with the operator interface 10, operates in one or more sequences of iterations to generate eligibility rules, redesign sequence scheduling rules 33 and rules for the solution selection knowledge module 24. During each sequence of iterations, the meta knowledge acquisition module 42 iteratively determines whether a redesign operator module 25 eliminates an operational discrepancy, as identified by the DISC ID discrepancy identification and DISC CAUSE ID discrepancy cause identification as determined by the diagnostic component 13. If so, the redesign operator module 25 is determined to be a candidate to be used in connection with eliminating the discrepancy, and the meta knowledge acquisition module 42 performs another iteration in which it selects another redesign operator module 25 to apply to the redesign to try to eliminate the discrepancy. If the discrepancy is not eliminated during an iteration sequence after a predetermined number of iterations, the meta knowledge acquisition module 42 returns to the initial design, and tries another sequence of iterations beginning with another redesign operator module 25 associated with the DISC ID discrepancy identification and DISC CAUSE ID discrepancy cause identification.

When the meta knowledge acquisition module 42 reaches a design whose operation corresponds to the operation defined by the DES OPL CHAR desired operational characteristics, as provided by the operator interface 10, the meta knowledge acquisition module 42 generates meta rules and abstracted meta rules for use in the eligibility rules 32, redesign sequence scheduling rules 33 and solution selection knowledge module 24. Each meta rule includes a left hand side whose conditions generally identify the DISC CAUSE ID discrepancy cause identification and the component of the design giving rise to the operational discrepancy, any DESIGN CONSTRAINTS imposed by the operator, and the identification of redesign modules 25 which may be used to perform a redesign operation to obviate or correct the discrepancy. The right hand side of the meta rule identifies one of the redesign modules 25, which is the preferred redesign module 25 to perform the redesign operation.

The abstracted meta rule generated by the meta knowledge acquisition module 42 is similar to the generated meta rule, with the exception that it does not include the redesign constraints. It will be appreciated, therefore, that the abstracted meta rule is of more general applicability than the meta rule, since it has fewer conditions, notably the redesign constraints, that must be met in order for the rule to fire. In applying the meta rules and abstracted rules during operation of the redesign component 14, it first determines whether meta rule will fire, and, if not, then determines whether an abstracted meta rule will fire. If an abstracted meta rule will fire, but no meta rules fire, during a redesign operation, a redesign operation may be performed which will result in an elimination or obviation of the operational discrepancy, but not within the DESIGN CONSTRAINTS imposed by the operator interface 10.

The meta knowledge acquisition module 42 receives various input values, including the design representation of the latest design, identified as DES REP [ORIG DES ID, (RED SEQ$_n$, ... )]. The index ORIG DES ID original design identification, identifies the original design representation of the design 11 provided by the operator interface 10. The index (RED SEQ$_n$, ... ) identifies the sequence of redesign sequences which have been determined, during the various successive iterations of the meta knowledge acquisition module 42, obviate or eliminate the operational discrepancies. Thus, if, at the end of an iteration, a redesign has no operational discrepancies, the sequence (RED SEQ$_n$, ... ) identifies the sequence of redesign sequences to be applied to the design 11 to eliminate the operational discrepancies.

The meta knowledge acquisition module also receives, at the beginning of each iteration, the DISC ID discrepancy identification indicating type of discrepancy, if any, between the simulated operational characteristics and the desired operational characteristics of the design, as determined by the simulation component 12, and the DISC CAUSE ID discrepancy cause identification as identified by the diagnostic component 13.

During each iteration, redesign operations may be initiated by the various redesign operator modules 25 to reduce or eliminate the identified discrepancy. When, after an iteration, a redesign has no operational discrepancies, the meta knowledge acquisition module 42 provides an output comprising the redesign, the specific meta rules, that is, the meta rules including the DESIGN CONSTRAINTS specified by the operator 10, and the abstract meta rules.

In operation, during the first iteration, the meta knowledge acquisition operator 42 first identifies a discrepancy, as determined by the simulation component 12, between the simulated operational characteristics and the desired operational characteristics of the design, the cause, as determined by the diagnostic component 13, of the discrepancy, and the available redesign sequences provided by the various redesign modules 25 which are indicated as being useful in connection with the identified discrepancy cause identification., and displays them for the operator interface 10. The operator interface 10 may then select one of the display redesign sequences. If the operator interface 10 determines that no redesign sequence is appropriate, it may initiate operation of the redesign module knowledge acquisition module 41, as described below in connection with FIGS. 5A through 5C, to define a redesign sequence for a new redesign module 25, which will then be used by the meta knowledge acquisition module 42. The meta knowledge acquisition module 42 then applies the selected or created redesign sequence to the design to form an initial redesign (step 100).

After the creation of the initial redesign, the meta knowledge acquisition module initiates a simulation by the simulation component 12 to determine whether the initial redesign eliminates the discrepancy (step 101). If so, the meta knowledge acquisition module 42 generates the meta rule and the abstracted meta rule as described above (step 102), and exits (step 103).

If, however, the meta knowledge acquisition module 42 determines, in step 101, that the redesign does not eliminate the discrepancy between the desired operation and the simulated operation, the meta knowledge acquisition module sequences to step 104, in which it determines whether the number of iterations of redesign operations, from the redesign operation in connection with the original design, exceeds a predetermined threshold. If so, it sequences to step 105, in which it determines whether any other redesign operator modules 25 exist which can be used to eliminate the discrepancy, that is, which are associated with the DISC ID discrepancy identification and DISC CAUSE ID discrepancy cause identification (step 105). If not, the meta knowledge acquisition module 42 exits (step 106).

If, on the other hand, the meta knowledge acquisition module 42 determines, in step 105, that other redesign operator modules 25 exist which can be used to eliminate the discrepancy associated with the DISC ID discrepancy identification and DISC CAUSE ID discrepancy cause identification, it sequences to step 107, in which it selects one of the redesign operator modules 25 and applies it to the initial design to form a redesign (step 107), and sets the number of redesign iterations to zero. Thereafter, the meta knowledge acquisition module 42 returns to step 101 to determine whether the redesign eliminates the discrepancy.

However, if the meta knowledge acquisition module determines, in step 104 (FIG. 4A), that the number of redesign iterations does not exceed the predetermined threshold, it sequences to step 108 (FIG. 4B) in which it determines whether any other unused redesign operator modules which are associated with the discrepancy identified by the DISC ID discrepancy identification and the DISC CAUSE ID discrepancy cause identification (step 108). If not, it exits (step 110). However, if the meta knowledge acquisition module determines that there are other redesign operator modules 25 which are associated with the discrepancy, it sequences to step 111 to select one and apply it to form a new redesign, increments the number of iterations, and returns to step 101 to determine whether the redesign eliminates the discrepancy.

As described above, the operator interface 10 may be required to define a new sequence of redesign operators for a redesign module 25. To accomplish that, the operator interface 10 uses the redesign module knowledge acquisition module 41, whose operation will be described in connection with FIGS. 5A through 5C. The general operations performed by the redesign module 41 knowledge acquisition module are depicted in FIG. 5A. Initially, the operator interface 10 creates a sequence of redesign operations in connection with a specific design and a set of redesign goals (step 120), the procedure for which is depicted in detail in FIG. 5B. The redesign goals are generally related to the causes of the discrepancies in operation as indicated by the diagnostic component 13. The operator interface 10 may, using several designs, create, using the operations comprising step 120, a number redesign sequences each associated with a particular identified discrepancy and discrepancy cause identification (step 121). Thereafter, the operator interface 10 may enable the redesign module knowledge acquisition module 41 to create a new redesign module (step 122) as described in FIG. 5C.

As noted above, FIG. 5B depicts the detailed operations in which the redesign module knowledge acquisition module 41 creates a sequence of redesign operations (step 120). With reference to FIG. 5B, the operator interface 10 initially provides redesign goals and selects the redesign operators which may be used to achieve the redesign goals (step 130). After selection of the redesign operators, the operator interface 10 defines the sequence by which they are to be applied to the design to perform the redesign operation (step 131). The operator then enables the redesign module knowledge acquisition module 41 to record the sequence and associate it with the identifications of the discrepancy and the cause of the discrepancy, and a name which is provided by the operator interface 10 (step 132). The name is used to identify the redesign module.

As indicated above (step 121, FIG. 5A), the operator interface 10 may enable the redesign module knowledge acquisition module 41 to iteratively apply the sequence depicted in FIG. 5B to create a plurality of redesign sequences to obviate a discrepancy and generate redesign to eliminate a discrepancy cause identification, and thereafter (step 122) use the redesign sequences so created to create a redesign module 25. The procedure used by the redesign module knowledge acquisition module 41 in creating the redesign module 25 is depicted in FIG. 5C.

With reference to FIG. 5C, the operator interface 10 enables the redesign module knowledge acquisition module 41 to retrieve the redesign sequences which it has recorded in connection with a particular discrepancy identification, discrepancy cause identification and redesign module name (step 140). Each of the redesign operators in the retrieved sequences may have a constant value identifying the module of the design to which it was applied during generation of the redesign sequence during steps 130 through 132, and the redesign module knowledge acquisition module 41 generalizes individual redesign operators by changing the constant value to a variable (step 141). The redesign module knowledge acquisition module 41 then takes the union of the redesign operators in all of the redesign sequences to thereby identify the redesign operator for performing each of the diverse redesign operations in all of the redesign sequences and forms therefrom the redesign operators module 27 in redesign module 25 (step 142).

Thereafter, the redesign module knowledge acquisition module 41 generates the eligibility rules 32 for the redesign module 25 (step 143). As indicated above, the eligibility rules identify the circumstances under which the redesign sequences provided by the redesign module 25 may be applied, and therefore each of the eligibility rules includes, as conditions in its left hand side, the identifications of the discrepancy and discrepancy cause identification which gave rise to the generation of the redesign operator sequence. Since the eligibility rule identifies the redesign module 25 as being available to perform a redesign operation when the operational discrepancy and cause therefor are identified by the simulation component 12 and diagnostic component 13, its right hand side includes the name of the redesign module 25.

Finally (step 144), the redesign module knowledge acquisition module 41 generates the redesign operator control rules 34 for each redesign sequence. The redesign operator control rules 34 identify the sequence of the redesign operators module 27 to be used in performing the redesign operation.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A method of redesigning a system performed by a data processor, comprising the steps of:
   identifying a discrepancy between the desired operation of the system and the expected operation of a design representation of the system stored in memory in the data processor;
   selecting a redesign module stored in the memory and associated with the identified discrepancy to be a candidate to redesign the system to eliminate the identified discrepancy;
   redesigning the system by modifying the design representation of the system according to a first sequence of redesign operators generated by the selected redesign module upon a decision that the first sequence of redesign operators is appropriate for redesigning the system;
   generating a new redesign module associated with the identified discrepancy and containing the redesign operators from a second sequence of redesign operators to be specified upon a decision that the first sequence of redesign operators is not appropriate for redesigning the system;
   storing the new redesign module in the memory to be available as a candidate to redesign the system to eliminate the discrepancy; and
   redesigning the system by modifying the design representation of the system according to a third sequence of redesign operators generated by the new redesign module.

2. A method according to claim 1, wherein said generating step comprises the steps of:
   generalizing the redesign operators in the first and second sequences of redesign operators;

generating a new set of redesign operators from the union of the generalized redesign operators;

placing the generated new set of redesign operators into the new redesign module;

generating new eligibility rules containing as a condition the identified discrepancy;

placing the generated new eligibility rules into the new redesign module;

generating new scheduling rules derived from the first and second sequence of redesign operators; and placing the generated new scheduling rules into the new redesign module.

3. A method according to claim 1, wherein said identifying step comprises the steps of:

storing in the memory a description of the desired operation of the system;

simulating the operation of the design representation of the system; and comparing the desired operation of the system and the simulated operation of the design representation of the system.

4. A method according to claim 1, further comprising the step of:

displaying the first sequence of redesign operators to allow an operator to decide whether the first sequence of redesign operators is appropriate for redesigning the system.

5. A method according to claim 1, further comprising the steps of:

recording specified redesign goals;

recording the second sequence of redesign operators; and saving the redesign operators in the recorded second sequence of redesign operators with the identity of the discrepancy and a redesign module name to be used in said generating step.

6. The method of claim 1, wherein the redesign module includes a redesign operator having a redesign operation production rule defining a primitive redesign operation, and wherein the generating step further comprises the step of:

generating the redesign operation production rule.

7. The method of claim 1, wherein the redesign module includes a plurality of redesign operation production rules and redesign scheduling information for defining a sequence of redesign operation production rules, and wherein the generating step further comprises the step of:

generating the redesign scheduling information.

8. The method of claim 1, wherein the redesign module includes eligibility information identifying a discrepancy that the redesign module is eligible to be used to eliminate, and wherein the generating step further comprises the step of:

generating the eligibility information.

9. The method of claim 1, wherein said first redesigning step creates a new design representation of the system, and further comprising the steps of:

determining whether the first redesigning step eliminated the identified discrepancy;

creating new solution selection rules for use in subsequent execution of the selecting step if the first redesigning step eliminated the identified discrepancy; and repeating the selecting step, first redesigning step, and determining step until the earlier of the elimination of the identified discrepancy and a predetermined number of repetitions.

10. A method of redesigning a system performed by a data processor, comprising the steps of:

storing in a memory in the data processor a description of the desired operation of the system;

simulating the operation of a design representation of the system stored in said memory;

comparing the desired operation of the system and the simulated operation of the design representation of the system to identify a discrepancy therebetween;

selecting a redesign module stored in the memory and associated with the identified discrepancy to be a candidate to redesign the system to eliminate the identified discrepancy;

displaying a first sequence of redesign operators generated by the selected redesign module to allow an operator to decide whether the first sequence of redesign operators is appropriate for redesigning the system;

redesigning the system by modifying the design representation of the system according to the first sequence of redesign operators if the first sequence of redesign operators is appropriate for redesigning the system;

recording a second sequence of redesign operators to be specified if the first sequence of redesign operators is not appropriate for redesigning the system;

generating a new redesign module associated with the identified discrepancy and containing the redesign operators recorded in the second sequence of redesign operators;

storing the new redesign module in the memory to be available as a candidate to redesign the system to eliminate the discrepancy; and redesigning the system by modifying the design representation of the system according to a third sequence of redesign operators generated by the new redesign module.

* * * * *